(12) United States Patent
Laughlin et al.

(10) Patent No.: US 10,779,423 B2
(45) Date of Patent: Sep. 15, 2020

(54) UNIVERSAL COMPANION INTERFACE FOR GATEWAY

(71) Applicant: Alpha Technologies Services, Inc., Bellingham, WA (US)

(72) Inventors: Gregory L. Laughlin, Bellingham, WA (US); Thomas Patrick Newberry, Blaine, WA (US)

(73) Assignee: ALPHA TECHNOLOGIES SERVICES, INC., Bellingham, WA (US)

( * ) Notice: Subject to any disclaimer, the term of this patent is extended or adjusted under 35 U.S.C. 154(b) by 0 days.

(21) Appl. No.: 16/214,337

(22) Filed: Dec. 10, 2018

(65) Prior Publication Data

US 2019/0191576 A1    Jun. 20, 2019

Related U.S. Application Data

(60) Provisional application No. 62/607,114, filed on Dec. 18, 2017.

(51) Int. Cl.
*H05K 5/02* (2006.01)
*H01R 27/00* (2006.01)
(Continued)

(52) U.S. Cl.
CPC .......... *H05K 5/0217* (2013.01); *H01R 27/00* (2013.01); *H04L 12/2803* (2013.01);
(Continued)

(58) Field of Classification Search
CPC .. H05K 5/0217; H05K 5/0208; H05K 9/0007; H05K 5/0239; H01R 27/00
See application file for complete search history.

(56) References Cited

U.S. PATENT DOCUMENTS 7,050,765 B2    5/2006  Ammar et al.
7,433,343 B1 *  10/2008 Smith ................... H04L 12/403
                                                    370/338

(Continued)

FOREIGN PATENT DOCUMENTS

AU    2012100359 A4    4/2012

OTHER PUBLICATIONS

International Search Report and Written Opinion for International Application Serial No. PCT/US2018/065050 dated Feb. 21, 2019, 9 pages.

(Continued)

*Primary Examiner* — Rockshana D Chowdhury
(74) *Attorney, Agent, or Firm* — Amin, Turocy & Watson, LLP

(57) ABSTRACT

The technology described herein is generally directed towards a gateway device (e.g., a cable modem or telecommunications modem) that is coupled to a base component. The base component couples to an interchangeable lid that is coupled to an electronic device. This forms a sealed housing for outdoor use, e.g., between a provider head end and the subscriber(s). A universal interface provides power or a network connection, or both, to the electronic device. The base component and/or the sealed housing protect the internal components against environmental effects. The base component and/or the sealed housing protect against external RF signals from entering, and internally generated RF signals from exiting.

18 Claims, 11 Drawing Sheets

(51) Int. Cl.
    *H05K 9/00*     (2006.01)
    *H04L 12/28*     (2006.01)
    *H02G 3/08*     (2006.01)
    *H02G 15/013*     (2006.01)
    *H02G 15/113*     (2006.01)

(52) U.S. Cl.
    CPC ......... *H05K 5/0208* (2013.01); *H05K 5/0239* (2013.01); *H05K 9/006* (2013.01); *H05K 9/0007* (2013.01); *H02G 3/088* (2013.01); *H02G 15/013* (2013.01); *H02G 15/113* (2013.01)

(56) References Cited

U.S. PATENT DOCUMENTS

| | | | |
|---|---|---|---|
| 7,433,361 | B1 | 10/2008 | Smith |
| 8,780,004 | B1* | 7/2014 | Chin ................ H01Q 1/526 343/841 |
| 8,957,757 | B1* | 2/2015 | Le Burge .......... G07C 9/00817 340/5.54 |
| 2006/0030220 | A1* | 2/2006 | Belopolsky ............ H01R 27/02 439/676 |
| 2009/0310317 | A1 | 12/2009 | Horten et al. |
| 2010/0253538 | A1* | 10/2010 | Smith .................. H01Q 1/2233 340/870.02 |
| 2014/0199990 | A1* | 7/2014 | Wolcott ................ H04W 92/06 455/422.1 |
| 2014/0258742 | A1* | 9/2014 | Chien .................... H04L 12/10 713/300 |
| 2014/0335803 | A1* | 11/2014 | Rivera ..................... H04B 1/38 455/90.3 |
| 2016/0233621 | A1* | 8/2016 | Ni ...................... H01R 13/6675 |
| 2016/0242232 | A1* | 8/2016 | Deros ................. F21V 33/0048 |
| 2016/0358435 | A1* | 12/2016 | Lee .................... H04N 5/23206 |
| 2017/0317752 | A1* | 11/2017 | McColloch ............ G02B 6/426 |

OTHER PUBLICATIONS

Oberon, "Secure Infrastructure Solutions for Wireless Networks," Catalog [online]. Oberon, Inc. 2014 1,4-9,11,13-15,17-22 [retrieved on Jan. 28, 2019]. Retrieved from the internet<URL:https:llwww.accu-tech.comlhs-fshub/54495/file-478459900-pdf/docs/oberonJlroduct_catalog_2014.pdf>, 96 pages.

International Preliminary Report on Patentability for International Application No. PCT/US20181065050 dated Jun. 23, 2020, 7 pages.

* cited by examiner

UNIVERSAL COMPANION INTERFACE FOR GATEWAY

RELATED APPLICATION

This application claims priority to U.S. Provisional Patent Application No. 62/607,114, filed Dec. 18, 2017, and entitled "UNIVERSAL COMPANION INTERFACE FOR GATEWAY", the entirety of which application is hereby incorporated herein by reference.

BACKGROUND

Communication systems such as cable television/internet providers employ outdoor gateway devices between the head end and the subscriber end. Other devices such as cameras are becoming commonplace near where such outdoor gateway devices are located.

BRIEF DESCRIPTION OF THE DRAWINGS

The technology described herein is illustrated by way of example and not limited in the accompanying figures in which like reference numerals indicate similar elements and in which.

DETAILED DESCRIPTION

Various aspects of the technology described herein are generally directed towards a gateway device (e.g., a cable modem or telecommunications modem) comprising an interface technology that facilitates connection or integration of external (e.g., third party) devices to the gateway device. For purposes of understanding, as used herein, "external devices" can be sometimes referred to as "third party devices" or the like, although it is understood that this is only an example; for example an external device need not technically be a device provided by or belonging to a third party, but rather can be a device provided by the same vendor of the gateway technology.

Example, non-limiting aspects of the technology described herein comprise a physical mounting interface for external device attachment, which in general provide a single device look and feel, and a physical power and/or network interface connection(s). Another example, non-limiting aspect comprises an interface that allows management data to be communicated between the invention and a third party device. Yet another example, non-limiting aspect comprises a communication method to allow, for example, cable operator network operations to manage third party devices through a network or other connection available via the technology described herein.

One or more implementations comprise a gateway device that powers directly from a Community Antenna TV (more commonly understood as "Cable TV", or CATV) outdoor powered Hybrid Fiber Coaxial (HFC) network, and delivers power and backhaul communication for third party devices such as radios and cameras. Other devices can include, but are not limited to devices related to deployable security surveillance, Wi-Fi, traffic control, digital signage or any other appliance requiring reliable power and high bandwidth backhaul. Other devices can include an external drive, a speaker, an input device such as a microphone, a technician's calibration device or diagnostic device, and so on. In one or more implementations, the technology enables rapid deployment of such third party devices using the CATV infrastructure for mounting, power and backhaul communications.

Figure 1:
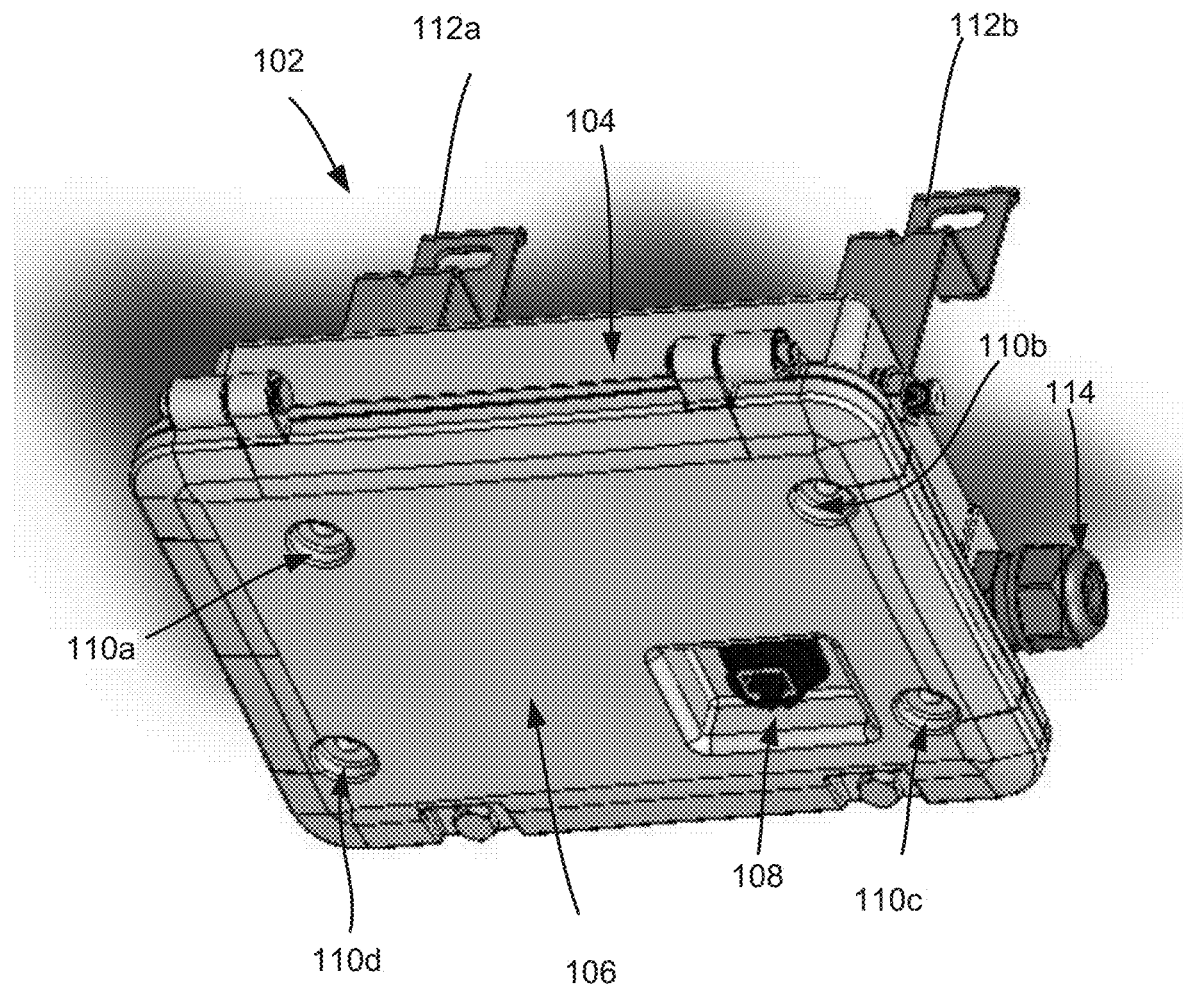
FIG. 1 is an example representation of a housing that contains a gateway device, in which the housing comprises a base component an interchangeable lid, in accordance with various aspects and implementations of the subject disclosure.

As generally represented in FIG. 1, in one or more implementations, the technology is implemented as a DOCSIS cable modem implemented in a water-tight, outdoor hardened housing 102, (where DOCSIS refers to the Data Over Cable Service Interface Specification, an international telecommunications standard). For example, one implementation of the housing 102, including a base component 104, interchangeable lid 106 and physical interface 108 seals the interior of the housing against environmental effects. In other implementations, at least the base component protects the gateway device against at least some environmental effects, including RF signals. Note that as used herein, the term "outdoor" refers to any location between a provider head end and the subscriber, even if contained in a "vault" or like container, or otherwise encased in some other enclosure.

In one or more implementations, the lid 106 that covers the base component 104 is interchangeable (replaceable) to enable multiple product offerings. For example, the interchangeable lid 106 can be coupled to (which includes containing/incorporating) an electronic device such as a camera. As will be understood, the electronic device can be powered by power from the base component, and can also communicate data via the base component, e.g., via the gateway device in the base component.

The technology can be powered by extracting power (and can also extract RF) from HFC and convert through a power supply unit and modem to deliver power and Ethernet backhaul communication for external network devices via a standard IEEE 802.3 at Power over Ethernet (PoE) connections. An example of a similar product, (without the technology described herein), is the Alpha® SMG-01PE gateway, commercially available from Alpha Technologies Inc.

As further shown in the example of FIG. 1, the housing 102 thus comprises the base component 104 that contains the gateway device (which for example can be a standalone product), the replaceable lid 106, with provisions 110a-110d, generally to directly mount (or possibly to indirectly mount) third party devices. While four provisions 110a-110d are shown, any practical number may be used, and need not be the same as each other. Such provisions 110a-110d can be, for example, threaded receptacles for screws, or any other suitable mechanical, magnetic or other type of coupling device. The provisions 110a-110d thus can provide mounting features to allow for direct mounting of third party products, e.g. security cameras, radios and so forth. Note that although not explicitly represented in FIG. 1, it is feasible to have mounting couplings that also serve as electrical contact connections. Thus for example, a separate connection point for electrical couplings can be eliminated or at least reduced in the number of contacts in alternative implementations.

FIG. 1 also illustrates the physical interface 108 (e.g., a connection point for one or more electrical couplings) integrated into the lid 106. The physical interface 108 can include customizable sub-connections that can provide a combination of delivery power and data network communication connections or the like. In one or more implementations, a power connector includes a remotely accessible power control relay to provide remote control of third party device(s). As can be readily appreciated, elements within the connection can vary, e.g., depending on third party device requirements.

By way of example, the interchangeable lid 106 can comprise one or more pieces that meet a customer's application, and may contain the electronics and/or ports required to meet specific customer applications. Brackets 112a and 112b can, for example, provide strand bracket mounting holes that can be coupled to/incorporated into the base with the lid facing the ground. Additional brackets/mounting holes (not explicitly shown) can be incorporated into the base's side for vertical mounting.

Note that one or more delivery port(s) 114 can be located on the side of the base, such as for access to the internal network and power connection(s). This port can be located on an adjacent side of the housing as the strand brackets, for example.

Figure 2:
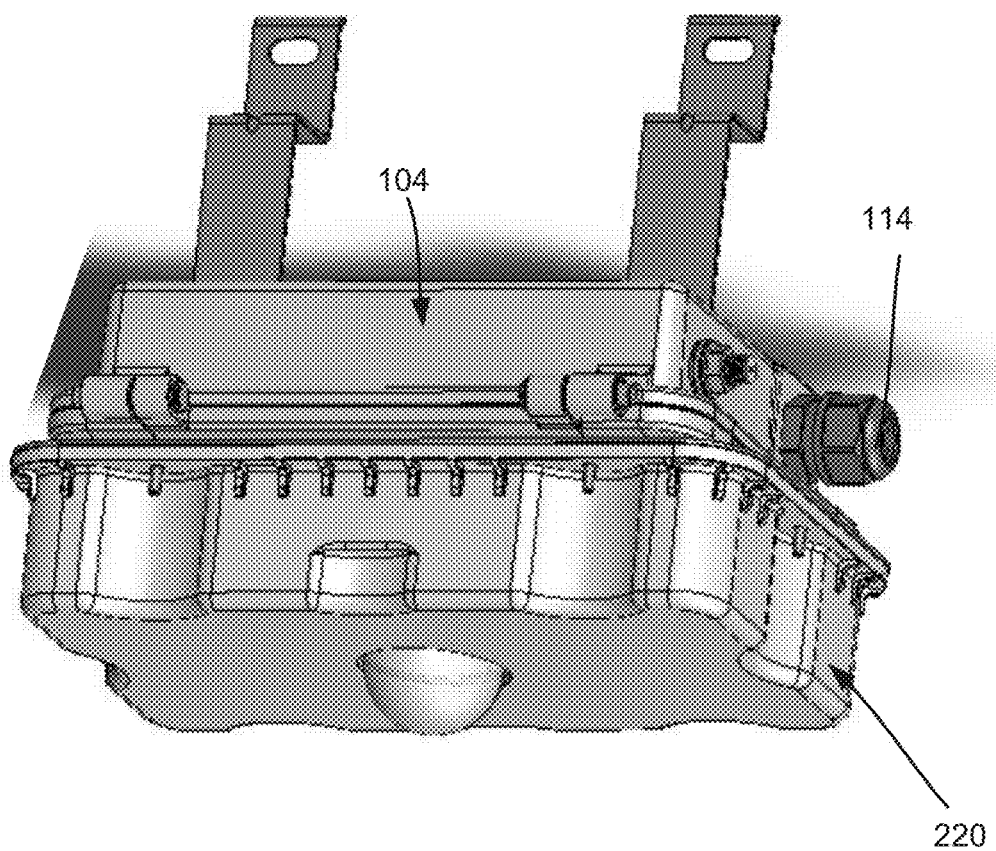
FIG. 2 is an example representation of a housing that contains a gateway device, in which the housing comprises a base component an interchangeable lid that is coupled to a camera, in accordance with various aspects and implementations of the subject disclosure.

FIG. 2 shows an example third party device 220 connected (in this example, via direct coupling) to the base component 104. In this example, the third party device also serves as the interchangeable lid component that when coupled to the base component 104, forms a housing. Example non-limiting third party device requirements for the interface connection (e.g., internal and/or via the port 114) can include one or more of the following:

Power: AC or DC voltage, or no power delivery
Network Backhaul: Ethernet, Fiber Optic, or no Network connection
Combination power and network: IEEE 802.3 Power Over Ethernet Classes I-V
A Physical connection between the Lid and the product's internal PCBs.

The internal connection to the connection point (corresponding to the physical interface 108) through the lid 106 is to a printed circuit board or the like using any suitable technology, possibly including a custom or proprietary technique that can be leveraged across multiple product offerings. A software management interface can be provided to allow the transfer of data (e.g., management data) between the base component 104 and any third party device coupled to the base component 104.

Thus, in one or more implementations the base component can be a strand mounted/mountable base component that accommodates an outdoor hardened HFC cable network gateway device, that couples to an interchangeable lid component containing an electrical device. In one or more implementations "strand mounted" is typically messenger cable-mounted between utility poles. In alternative implementations, the base component can be mounted to a pole, a wall or enclosed/mounted to a vault. Note that regardless of how mounted, the base component is configured to support an electronic device coupled to the interchangeable lid component; even if physical support is not actually needed in a certain orientation, the base component still provides electrical and/or data network support to the electronic device as needed.

Indeed, the technology described herein provides a universal interface that provides at least one electrical connection between the electronic device in the lid and the gateway device in the base. That is, the universal interface comprises the electrical and/or network connections from the base component to the lid component. The universal interface can be accessible through the interchangeable lid component and/or accessible through the base component.

In one or more implementations, when the lid component is coupled to the base component, a sealed housing is formed. Note that the base component can protect the gateway device and the interchangeable lid component can protect the electrical device. The sealed housing, e.g., via a sealing gasket threaded receptacles for screws to couple the base component to the interchangeable lid component via spring-loaded screws, further protects the gateway device in the base component and the electronic device in the lid component, as well as the universal interface, against external environmental effects. In one or more implementations, for example, the sealed housing is watertight, able to withstand up to twenty pounds per square inch internal air pressure at forty-six feet submersion/can maintain an IP68 watertight rating (will withstand 20 PSI internal pressure without leakage).

The base component can comprise a Faraday cage that protects the gateway device from electromagnetic fields/radiation/RF signals and so forth. Moreover, the base component Faraday cage can prevent RF signals/radiation generated internally by the network device from being received by external component(s); e.g., protects against noise from getting into the Cable Network. In one or more implementations, the base component with gateway device and/or sealed housing can at least meet emission requirements of an FCC Class B (FCC CFR 47 Part 15 Class B) United States device, an ICCES-003 Canada device, and a European Union/Global CISPR 32 (IEC/EN 55032) multimedia equipment device, and can at least meet electromagnetic compatibility (EMC) immunity requirements of CISPR 24 (IEC/EN 55024) for Information technology equipment and CISPR 35 (ICE/EN 55035) for multimedia equipment.

The housing (when the lid is coupled to the base component) can complete or add to a Faraday cage to protect the interior of the housing, including the electrical device.

In one or more implementations, the base component with gateway device and/or sealed housing can comprise: UL50E/Type 6 electrical equipment as certified by Underwriters Laboratories Incorporated and has a European ingress protection rating of IEC 60529 IP67; ensure functional, operational and mechanical performance with minimal deterioration after subjected to 1000 hour Accelerated Salt Spray Test (ASST) per ASTM B117 standard; perform within an operating temperature range of about −40 degrees centigrade to +60 degrees centigrade; and/or at least meet surge immunity requirements of IEC 61000-4-5 of 6 kV/3 kA on COAX input port, 4 kV on Ethernet port (1.2×50/8× 20) and UL/CSA 60950-1 line cross comprising 277VAC on Ethernet ports.

The interchangeable lid component to the base component can be configured to deter access (e.g., can be lockable/tamperproof, etc.) to the gateway device contained in the base component and the electronic device contained in the lid component. There can be multiple levels of authorized access; for example, a third-party/vendor can have access to service the interchangeable lid component and the electronic device, but is unauthorized and deterred from access to the gateway device, e.g., via a double locking system, tamperproof detection and so on.

Figure 3:
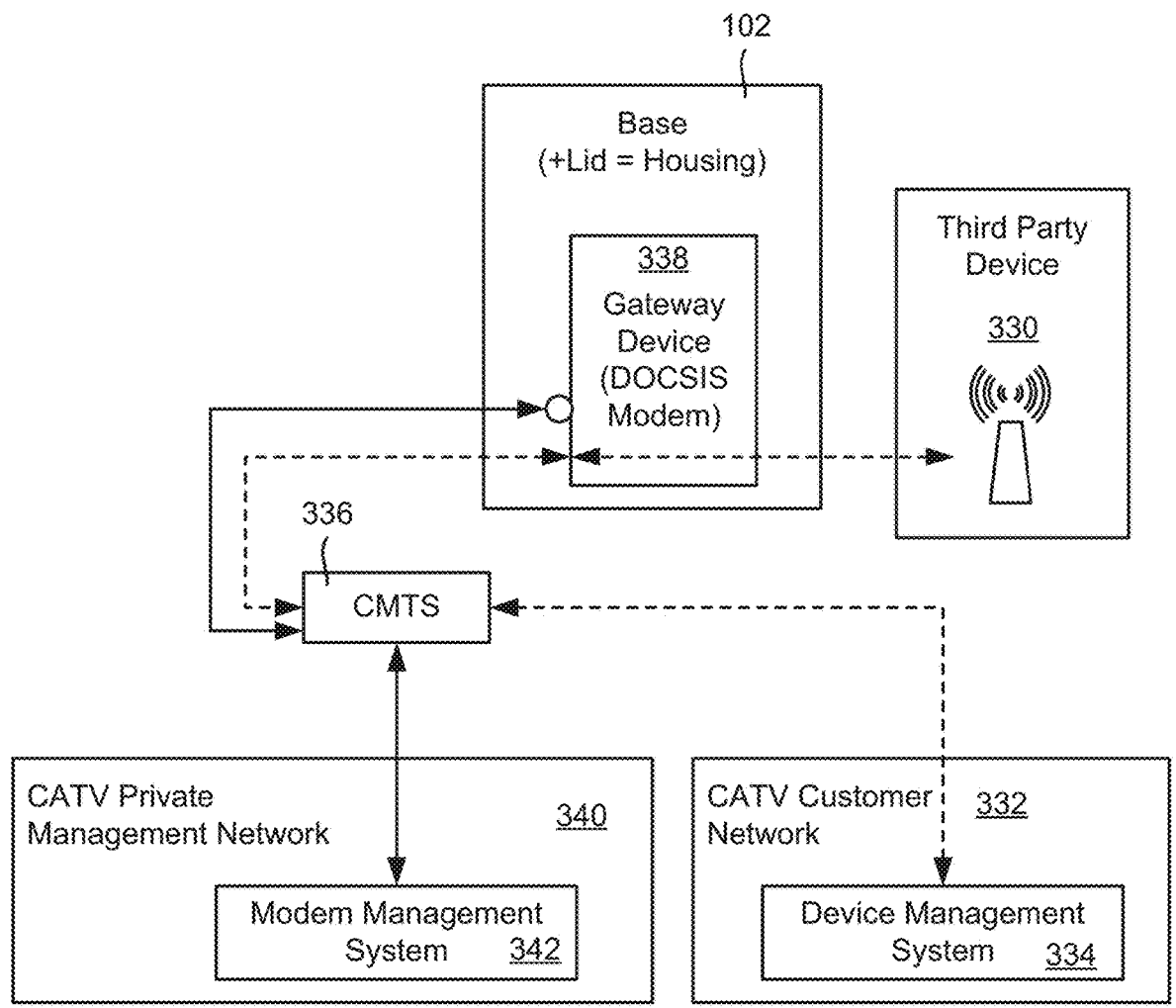
FIG. 3 is an example block diagram representation of a third party device managed by connecting through a customer network, in accordance with various aspects and implementations of the subject disclosure.

As represented in FIG. 3, in contemporary systems, third party devices such as the third party device 330 are managed by connecting through the customer network 332 via a device management system 334 through a cable modem termination system (CMTS) 336. The base component 102 (e.g., with the interchangeable lid to form the housing) with a gateway device (e.g., DOCSIS modem) 338 can be incorporated into such an existing system, for example by being managed by a CATV private management network 340 and modem management system 342 therein.

Figure 4:
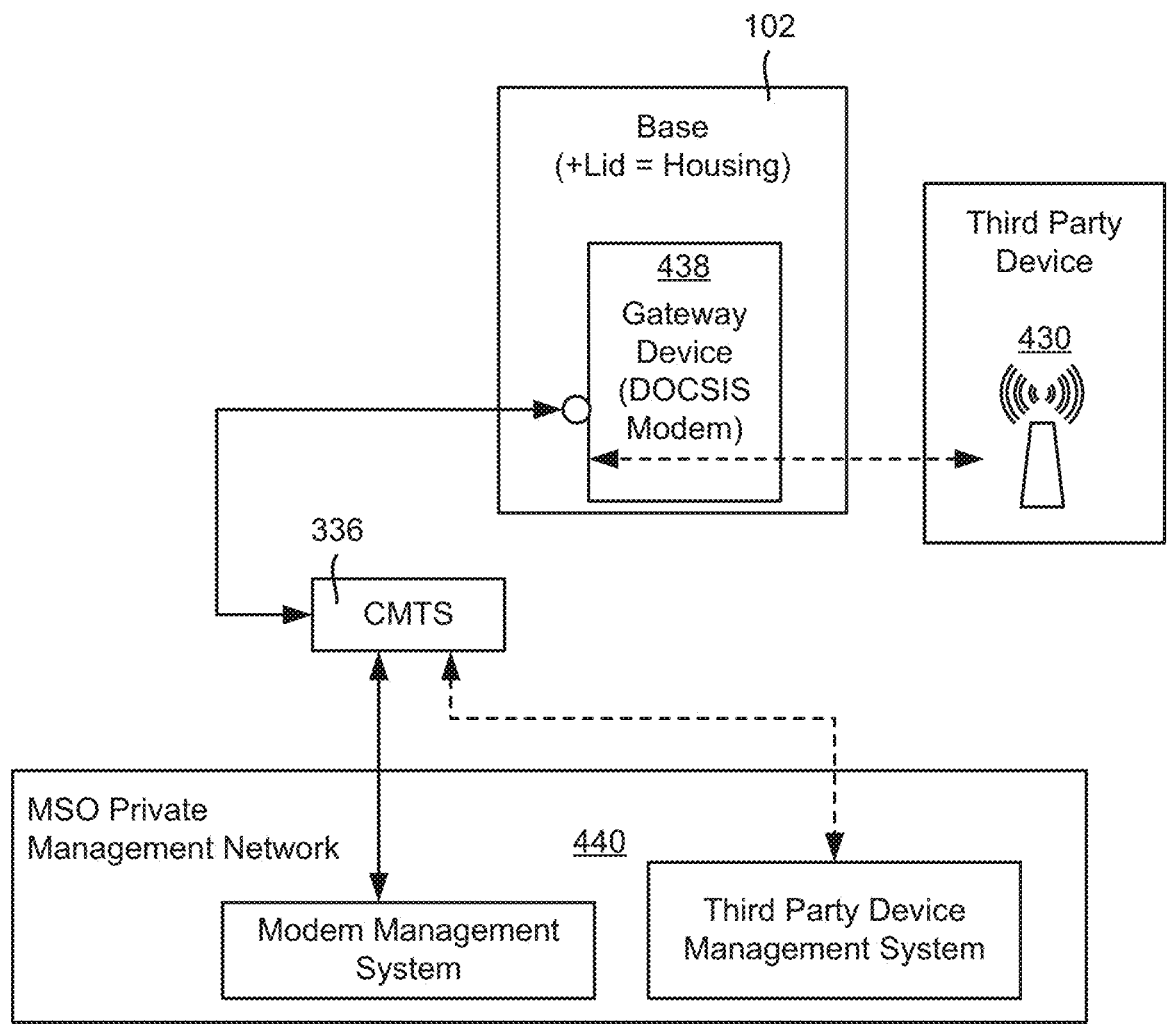
FIG. 4 is an example block diagram representation of a third party device managed through a cable management network, in accordance with various aspects and implementations of the subject disclosure.

Moreover, as shown in FIG. 4, the technology described herein further provides the capability (e.g., through firmware) to manage a third party device 430 through a network connection of the gateway device/cable modem 438. In this way, the gateway device/cable modem 448 bridges two separate networks, namely the cable modem management network (multiple service operator, or MSO private management network 440, which is tightly firewalled and accessible only by the cable operator, and the customer network, which is the public facing network that provides IP connectivity to the third party devices. Thus, the technology as generally represented in FIG. 4 allows management of third party devices through the cable management network, proving extra security and preserving IP address allocation on the customer network.

In one or more implementations, there is provided a powered (e.g., 120 Watt) gateway design that accommodates multiple configurations. Example, non-limiting, sub-models include:
  PoE+ outputs with DOCSIS3.1 backhaul, one or more ports located on base,
  53VDC power output with a separate Ethernet connection, one or more ports located on base,
  53VDC power-only delivery (no modem), one or more ports located on base,
  53VDC power output with a separate Ethernet connection, one or more ports located on lid,
  two PoE+ outputs with DOCSIS3.1 backhaul, one or more ports located on base, one or more ports located on base,
  up to four (4) 120VAC outputs with DOCSIS3.1 backhaul, one or more ports located on base, one or more ports located on base,
  up to four (4) 90VAC outputs with DOCSIS3.1 backhaul, one or more ports located on base, one or more ports located on base,
  90VAC power output with a separate Ethernet connection, one or more ports located on base,
  90VAC power-only delivery (no modem), one or more ports located on base,
  90VAC power output with a separate Ethernet connection, one or more ports located on lid,
  120VAC power output with a separate Ethernet connection, one or more ports located on base,
  120VAC power-only delivery (no modem), one or more ports located on base,
  120VAC power output with a separate Ethernet connection, one or more ports located on lid.

Note that it is feasible to have more than one Ethernet connection on a given device implementation. Further note that references 53VDC are synonymous with products that deliver (or receive) a range of DC voltages near 48VDC. Still further, any combination of 53VDC, 90VAC and/or 120VAC can be provided as desired.

Further, any model can have additional options, including, but not limited to:
  status monitoring plus low voltage disconnect,
  GPS, (the housing can accommodate an externally-mounted GPS antenna, or the product can have an integrated modem that contains an integrated GPS antenna),
  incorporate industrial design elements to improve look and feel,
  incorporate proprietary third party device mounting features,
  incorporate proprietary power and network delivery connections,
  design internal components for multiple product offerings,
  release models for domestic and international customers.

In one or more implementations, a form factor is as small as possible or as otherwise desired to incorporate the desired components, generally attempting to maintain the smallest possible thickness (depth) of the housing. The housing can be designed around the concept of having the coax interface, power conversion, backhaul and delivery modules reside in the housing base. In this way, multiple products can be developed by re-using the base.

The technology includes aspects related to physical mounting, power and backhaul connections, device-to-device status sharing, and allowing remote management of third party device through the cable modem management network. One or more implementations allow service via common technician tools.

In addition to the above-described design concepts, the technology may incorporate common features where feasible, such as SNMP functions and web page layout, while meeting agency requirements and environmental requirements.

Summarizing various aspects described herein with respect to one or more example implementations, there is provided various levels of total power and network backhaul delivery to connected device(s), status monitoring of power and backhaul connections, individual remote power control power ports, BSoD Support for Layer 2 management, RIP protocol to support NAT, PAT and Static IP Assignment.

The housing is designed to accommodate multiple configurations and mounting preferences. This can be accommodated through multiple mounting and port locations as well as multiple lids. Non-limiting example possible lids include the following:

Lid 1: No delivery port. Features incorporated into lid to allow for multiple third party device attachments.

Lid 2: access port on lid will provide 48VDC connection and Ethernet connection to device that is mounted to the lid. Features incorporated into lid to allow for multiple third party device attachments.

Lid 3: access port on lid will provide a PoE+ connection to device that is mounted to the lid. Features incorporated into lid to allow for multiple third party device attachments.

Lid 4: custom lids, developed on a case-by-case basis, such as through a joint development project with a third party partner, where the lid is designed to allow a specific third party device to integrate with the modem product.

In one or more implementations, the product can provide an interface to the broadband access network via a coaxial connection which carries both voltage and communication, separates the power and communications from the Coax RF, and/or delivers communications to a DOCSIS modem while also delivering to the power module. The product can accept power from the coax extraction module and convert it to provide power to both the delivery module and embedded cable modem module.

Different power supply unit configurations can be provided to satisfy different implementations; e.g., a) Power+low voltage disconnect+Status Monitoring+Remote Power Control b) Power Only—No low voltage disconnect or Status Monitoring c) Power+low voltage disconnect Multiple delivery modules can be provided to meet requirements of any specified sub-model, such as with the below general functions:

Inserts power into Ethernet line (PoE+ models)
remote control hardware for PoE+ connections
connection for direct voltage delivery
power protection
Ethernet protection One or more implementations utilize a DOCSIS 3.1 embedded cable modem module for backhaul and status reporting. Digital step attenuation (DSA) can be incorporated into the DOCSIS 3.1 modem.

In one or more implementations, a gateway manager resides within an on-board processor and provides any system management functionality desired. Gateway management functions can include, but are not limited to the following:

collect and report gateway system status
manage gateway system, e.g. watchdogs, system initialization, alarms
manage user interfaces
manage connected device power control.

Figure 5A:
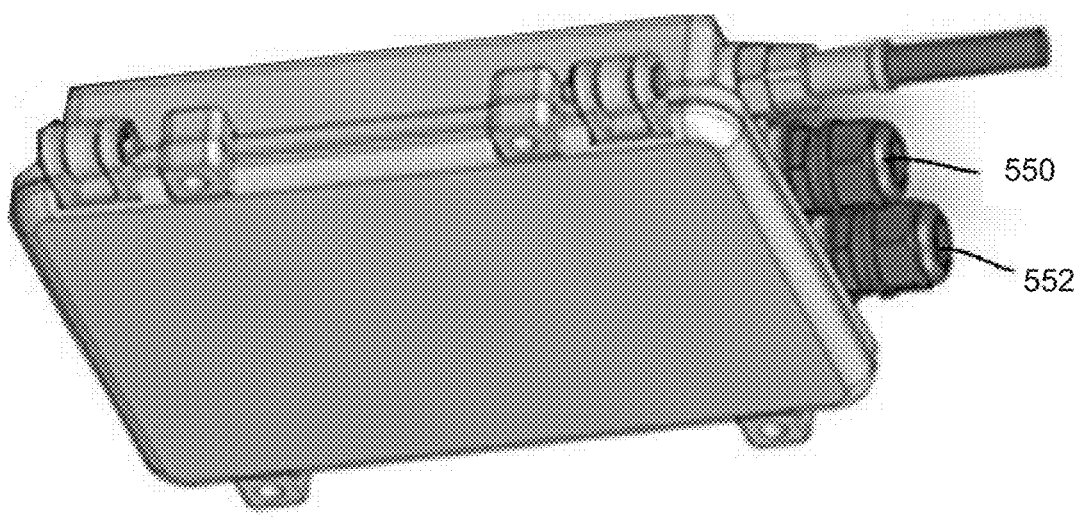
FIG. 5A is an example representation of a housing having an interchangeable lid with no interface, and having two ports on the base component, in accordance with various aspects and implementations of the subject disclosure.

Turning to some non-limiting examples of use cases, FIGS. 5A, 5B, 6A, 6B, 7A and 7B show connected devices (comprising an in-house or third party product that can accept power, backhaul and/or possibly mounting from the gateway product, e.g. a camera, radio, etc. In general, FIG. 5A shows a product similar internally to FIG. 1. Note however that FIG. 5A shows a product having no interface in the lid; instead FIG. 5A illustrates a product with two PoE+ delivery ports on the base of the product, or alternatively a product with 48VDC and Ethernet delivery ports on the base. These ports are represented as 550 and 552.

Figure 5B:
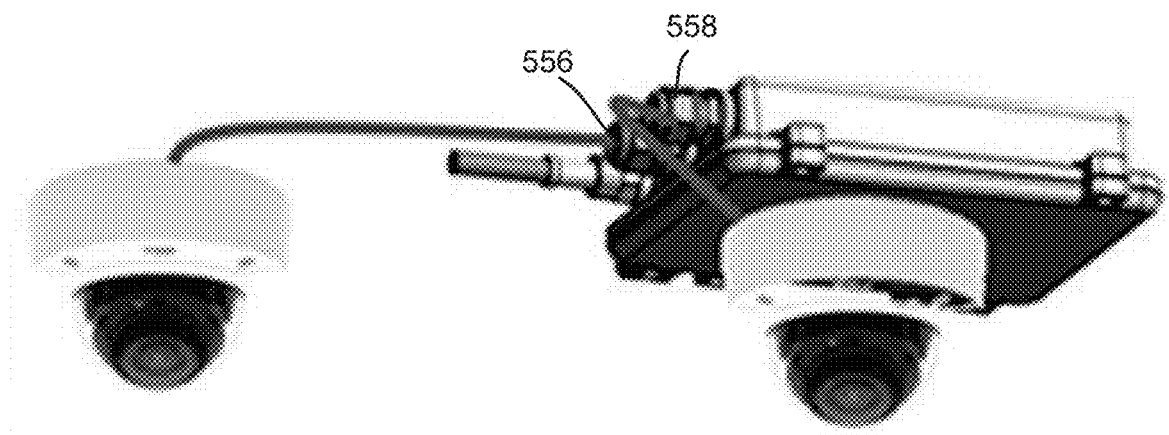
FIG. 5B is an example representation of a housing having externally connected device(s) and ports on a base component, in accordance with various aspects and implementations of the subject disclosure.

FIG. 5B exemplifies a product that services one or two externally connected third party (e.g., 'Off-the-shelf') PoE+ Device(s). In this example use case, base delivery ports located on the side of the base are used. For example, the delivery module has side-facing RJ-45 connections(s), and can provide Ethernet protection and PoE+ power protection. These ports are represented as 556 and 558; note however that the lid interface can provide connections for at least one of the external devices in place of any port. The lid can, for example, contain 'generic' or custom mounting features.

Figure 6A:
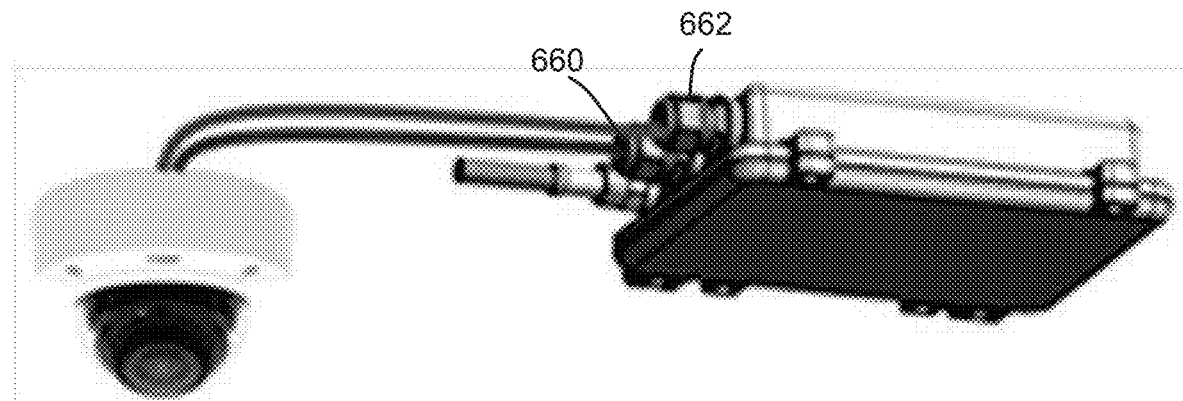
FIG. 6A is an example representation of a housing having an externally connected device with power and data couplings to base component ports, in accordance with various aspects and implementations of the subject disclosure.

FIG. 6A shows another use case, in which an External "Off-the-shelf" device needs 53VDC+Ethernet. In this example, a base delivery port is used for 53VDC, and another base delivery port is used for Ethernet; Ethernet protection can be provided. These ports are represented as 660 and 662.

Figure 6B:
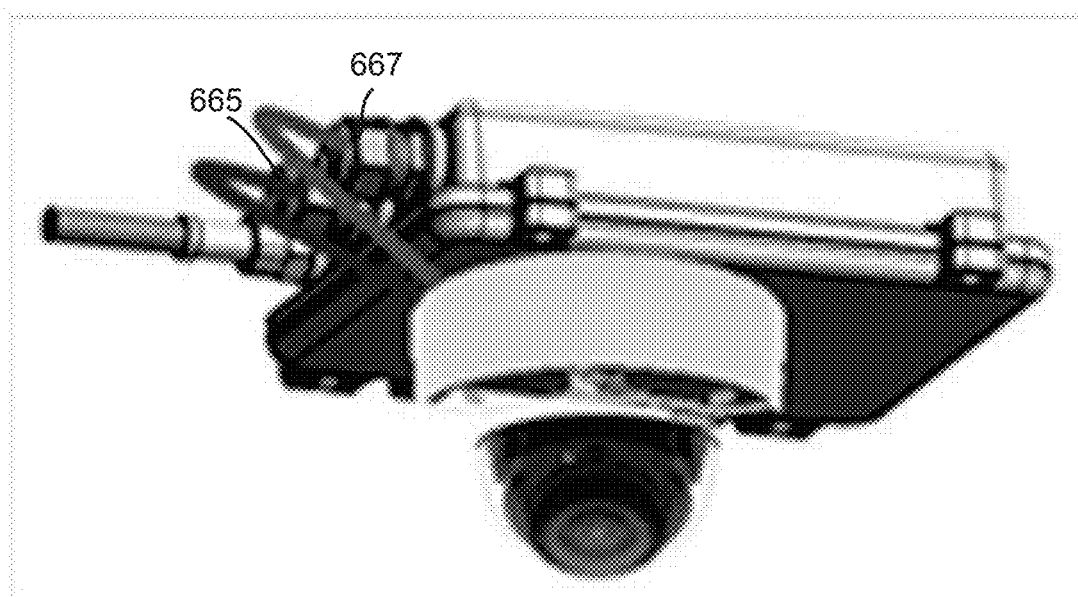
FIG. 6B is an example representation of a housing having a lid mounted device coupled to power and data ports on a base component, in accordance with various aspects and implementations of the subject disclosure.

FIG. 6B exemplifies yet another use case. In this example, the ports (665 and 667) can be the same as in FIG. 6A (or reversed), however unlike FIG. 6A, in FIG. 6B, the lid contains mounting features. Thus, electrical (power and/or communications) connections can be made via a lid interface.

Figure 7A:
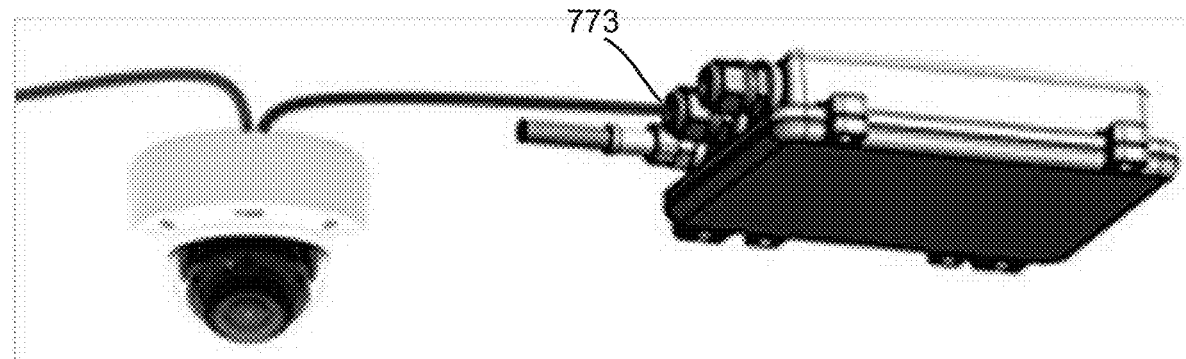
FIG. 7A is an example representation of a housing having an externally connected device with a power coupling to a base component port, in accordance with various aspects and implementations of the subject disclosure.

FIG. 7A exemplifies another use case in which an external device only needs 53VDC Power, e.g., up to 120 W. As can be seen in this example, the connected device only has a port 773 with a direct 53VDC power connection; no backhaul technology is needed. Instead, for example, the device will use external communications (e.g., fiber, wireless, etc.) as desired.

Figure 7B:
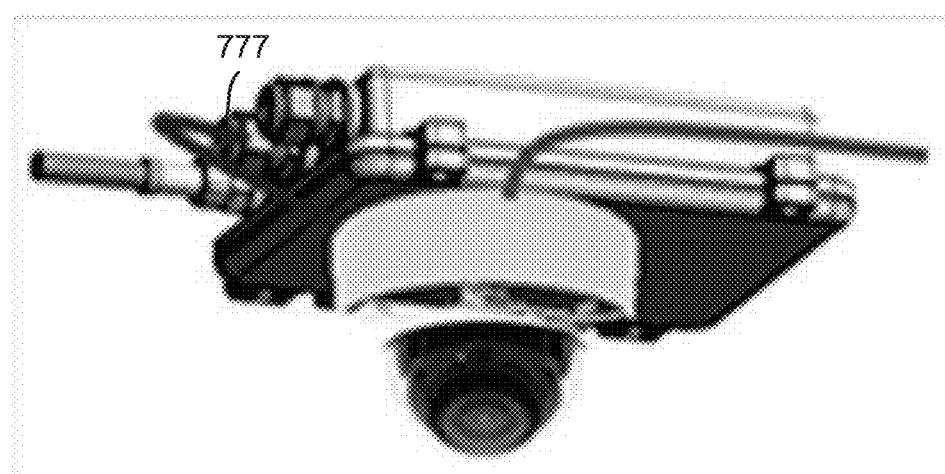
FIG. 7B is an example representation of a housing having a lid mounted device with a power coupling to a base component port, in accordance with various aspects and implementations of the subject disclosure.

FIG. 7B exemplifies yet another use case similar to the use case of FIG. 7A, but having the external device mounted to the lid. Thus, in this example, again the attached device only requires 53VDC Power, up to 120 W, (via port 777) with its own external communications (no internal backhaul required). However, as shown to the devices mounted to the lid via mounting features incorporated into the lid. Because it is mounted, the port 777 can be unused or even eliminated, with electrical connections (power in this example) via a lid interface.

One other example use case was previously depicted with reference to FIG. 2. In FIG. 2, consider that the use case is that of an external device that needs attached 53VDC/Ethernet connected device with direct lid access. In other words, the third party device has been specifically designed to integrate with the modem product. Power and network backhaul connections are made through the lid, and thus the delivery module has lid-facing Ethernet and power connections. As can be readily appreciated, the lid may be generic, at least to an extent, or the lid can be designed specifically for the third party device. A shield can be placed between the modem product and the third party device.

Figure 8:
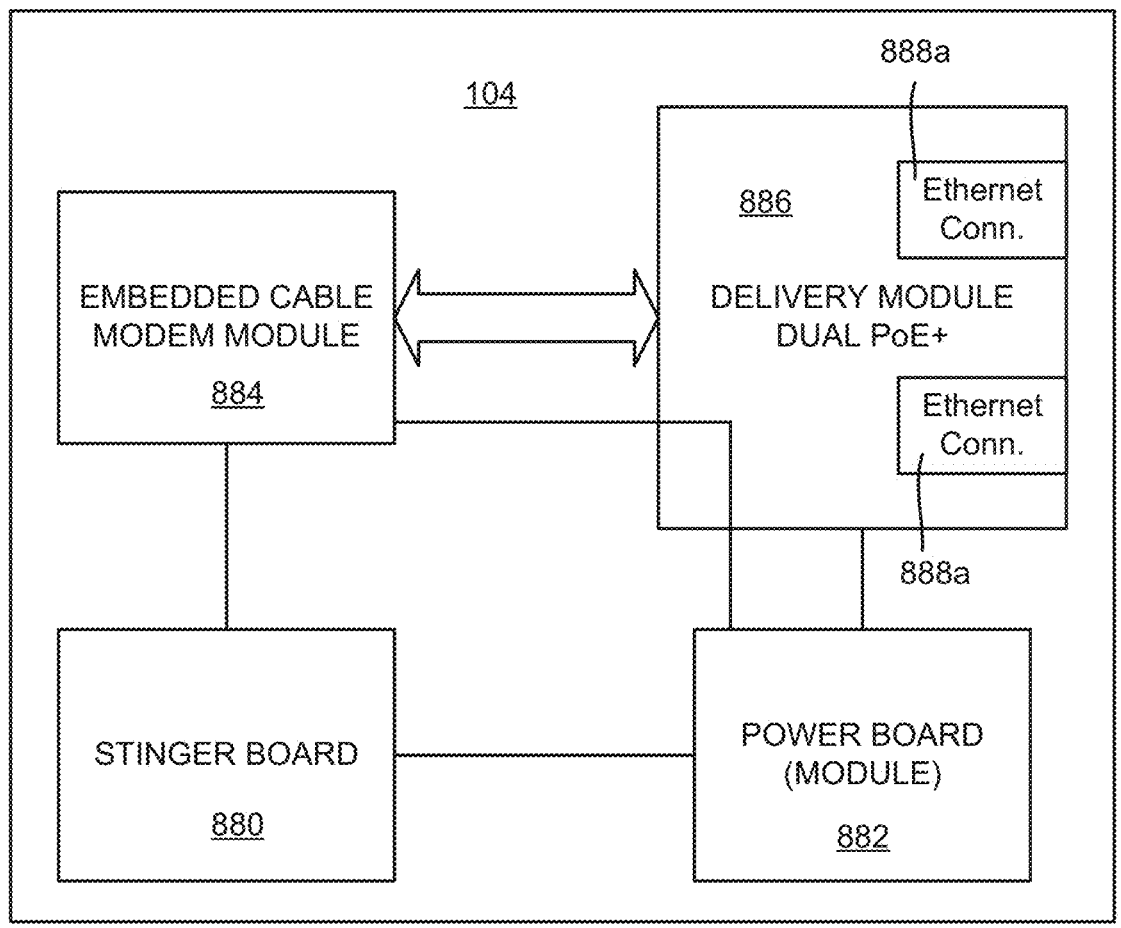
FIGS. 8-10 are example schematic electronic component diagrams of products incorporating the technology described herein, in accordance with various aspects and implementations of the subject disclosure.
Figure 9:
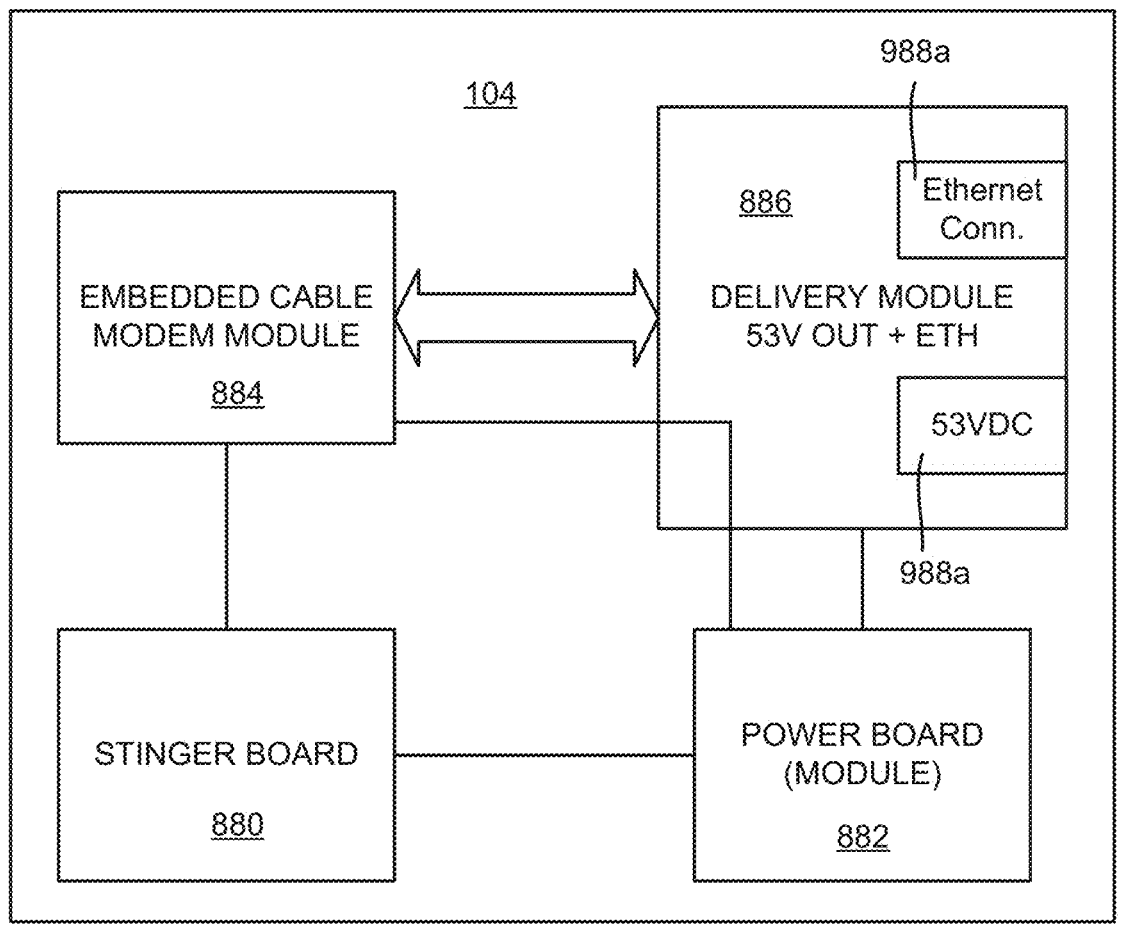
Figure 10:
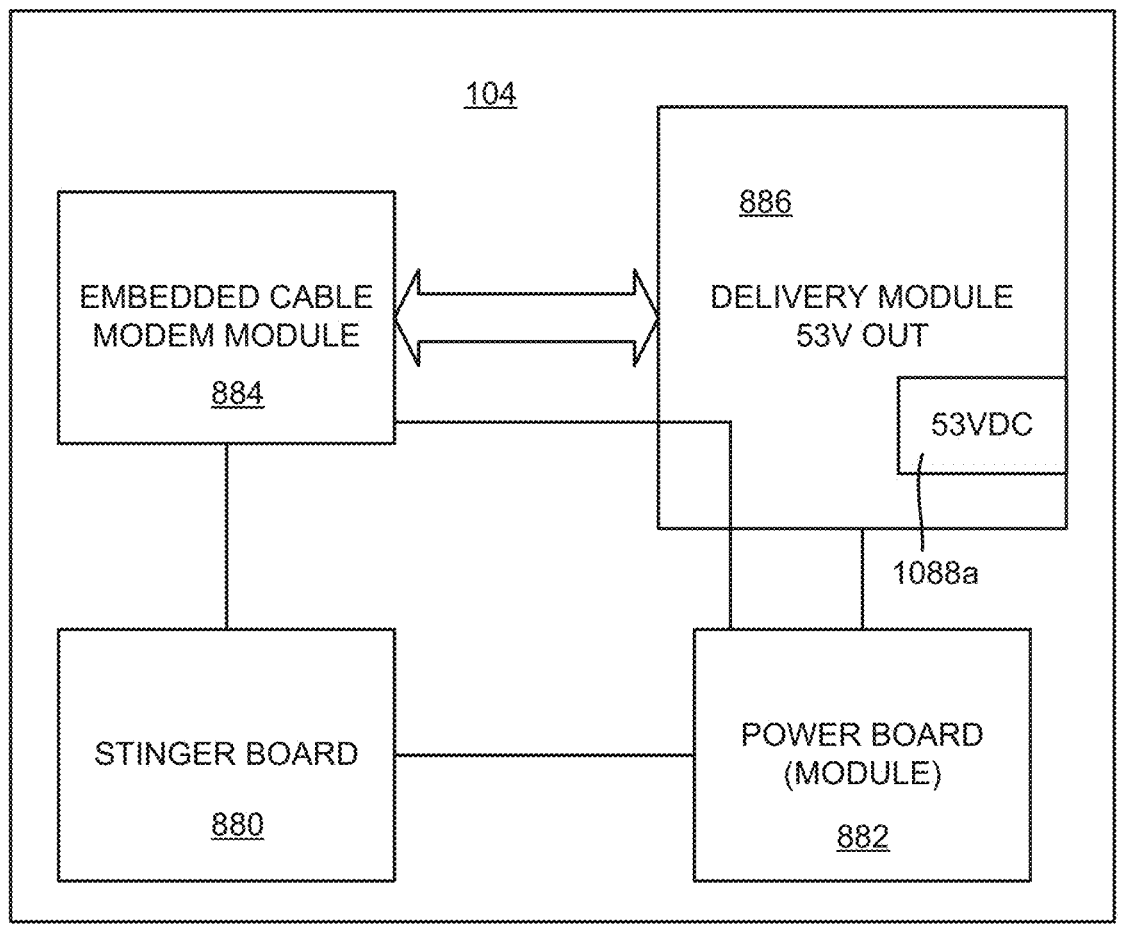

FIGS. 8-10 are example schematic electronic component diagrams of products incorporating the technology described herein. In general, the products are exemplified as containing four elements, namely a Stinger board 880, power supply module (power board) 882, embedded cable modem module 884 (the gateway device), and delivery module 886, which can be incorporated into the base component 102. The core of the product can perform the power and backhaul functions as appropriate.

FIG. 8 shows a product implementation in which two Ethernet connectors, respectively are provided, e.g. as delivery module ports 888a and 888b of the delivery module 886. The ports 888a and 888b can be on the base 104 or through the lid interface (not explicitly shown), or a combination of both.

FIG. 9 shows a product implementation in which an Ethernet connector (port 988a) and 53 VDC (port 988b) are provided as outputs. As can be readily appreciated, other types of connectors (e.g., USB) and/or voltage output (including AC or DC) can be provided in a similar product implementation.

FIG. 10 shows a product implementation in which 53 VDC (via port 1088a) is provided as output; no other output port is provided in this particular product implementation. As is understood, in alternative product implementations, 90 VAC and/or 120 VAC can be provided instead of or in addition to 53 VDC, and so on, and one or more data ports can be present.

Note that any display devices (e.g., LEDs) can be internal to the housing. If present, LEDs (Modem, CPE, Power) can be visible through the delivery port.

One or more example aspects are directed towards a system comprising, an outdoor base component that accommodates a gateway device, the base component configured to couple to an interchangeable lid component to form a housing when the interchangeable lid component is coupled to the base component. The base component can be configured to support an electronic device coupled to the interchangeable lid component, and the base component can be configured to provide a universal interface that provides at least one electrical connection between the electronic device and the gateway device.

The universal interface can be accessible through the interchangeable lid component. The universal interface can be accessible through the outdoor base component.

The outdoor base component can protect the gateway device against external environmental effects. The housing can comprise a sealed housing that protects the gateway device against external environmental effects when the interchangeable lid component is coupled to the outdoor base component.

The electronic device coupled to the interchangeable lid component can be built into the interchangeable lid component.

The outdoor base component can be further configured to be strand mounted. At least part of the outdoor base component can protect the gateway device against external sources of electromagnetic radiation, and protect against external emission of RF signals internally-generated within the outdoor base component.

The outdoor base component that accommodates the gateway device can accommodate hybrid fiber coaxial cable network gateway device.

The universal interface that provides the at least one electrical connection between the electronic device and the gateway device can provide power to the electronic device. The universal interface that provides the at least one electrical connection between the electronic device and the gateway device can provide a data communication port for the electronic device.

At least part of the base component can be configured to deter unauthorized access to the gateway device.

One or more example aspects are directed towards an interchangeable lid component coupled to an electronic device and a base component that couples to the interchangeable lid component to form a housing. The base component can contain a gateway device and support the interchangeable lid component and electronic device. The housing can be configured with a universal interface that provides at least one electrical connection between the electronic device and the gateway device.

The housing can be sealed to protect the gateway device against external environmental effects. The base component can comprise a Faraday cage that surrounds the gateway device.

The universal interface that provides the at least one electrical connection between the electronic device and the gateway device can provide power to the electronic device and/or provide a data communication port for the electronic device.

The base component can comprise an access deterrent component that deters unauthorized access to the gateway device. The base component can be configured to be strand mounted. The interchangeable lid component coupled to the electronic device can contain the electronic device.

One or more example aspects are directed towards an interchangeable lid component coupled to an electronic device, the interchangeable lid component configured to couple to a base component that contains a gateway device, to form a housing that supports the interchangeable lid component and electronic device. The housing can be configured with a universal interface that provides at least one electrical connection between the electronic device and the gateway device.

The interchangeable lid component that is coupled to the electronic device can contain the electronic device. The electronic device can comprise at least one of: a camera, microphone, an external drive, a speaker, a calibration device, a diagnostic device, a cellular communications device, and/or a wireless access point device.

The universal interface can be accessible through the interchangeable lid component.

Figure 11:
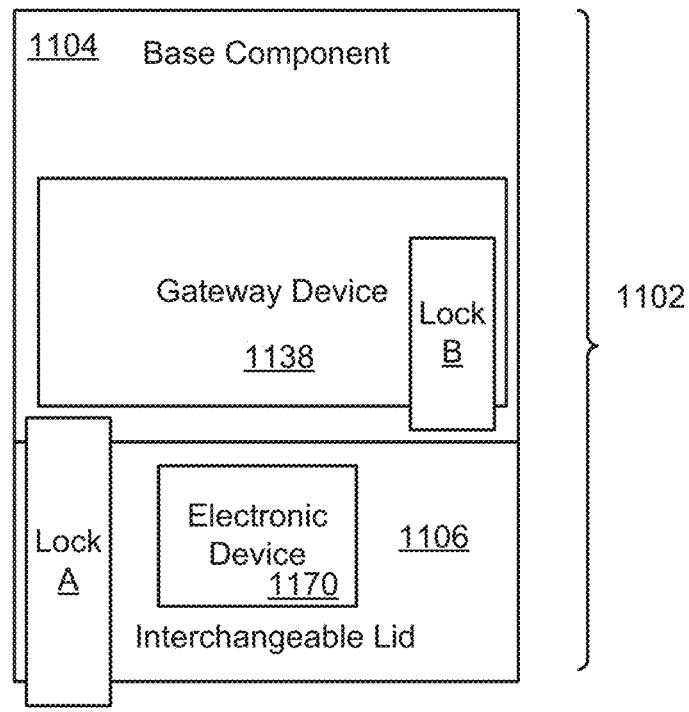
FIG. 11 is an example block diagram representation of first access and second level access deterrent components, in accordance with various aspects and implementations of the subject disclosure.

As represented in FIG. 11, a first access deterrent component (e.g., a lock A) can be provided that deters access to the housing 1102. For example, the first access deterrent component (lock A) can prevent an unauthorized user from opening the housing 1102 to remove the lid 1104, and access the electronic device 1170 coupled thereto. Even once the housing 1102 is opened, the base component 1104 can comprise a second access deterrent component (e.g., a lock B) that deters unauthorized access to the gateway device 1138 (as well as possibly other components therein, e.g., the power module and so forth).

As can be seen, a next generation product comprising a base component with a gateway device is described. For example, the gateway device can comprise a DOCSIS 3.1 modem (and future versions) for backhaul, and implement an architecture designed for multi-product flexibility. One or more implementations of the product physically connects to the HFC Coaxial Access network via a power-passing tap at any location within the HFC voltage range (45-90VAC Quasi Wave). One or more implementations of the product can transform HFC power and RF and deliver power to a connected device, backhauling through an integrated outdoor hardened DOCSIS 3.1 cable modem, for example. The design allows for release of multiple product models through replacement of system modules (Power, Delivery). This technology can reduce costs by having a single design that can have multiple purposes through various connection options.

What is claimed is:

1. A system comprising, an outdoor base component that accommodates a modem, the base component configured to couple to an interchangeable lid component to form a housing within which the modem is located when the interchangeable lid component is coupled to the base component, the base component configured to support an electronic device externally mounted to the interchangeable lid component such that the electronic device is located outside the housing, and the base component configured to provide a universal interface that provides at least one electrical connection between the electronic device and the modem, wherein the universal interface is accessible through the interchangeable lid component, and wherein the electronic device externally mounted to the interchangeable lid component is built into the interchangeable lid component.

2. The system of claim 1, wherein the outdoor base component protects the modem against external environmental effects.

3. The system of claim 1, wherein the housing comprises a sealed housing that protects the modem against external environmental effects when the interchangeable lid component is coupled to the outdoor base component.

4. The system of claim 1, wherein the outdoor base component is further configured to be strand mounted.

5. The system of claim 1, wherein at least part of the outdoor base component protects the modem against external sources of electromagnetic radiation, and protects against external emission of RF signals internally-generated within the outdoor base component.

6. The system of claim 1, wherein the outdoor base component that accommodates the modem accommodates a hybrid fiber coaxial cable network modem.

7. The system of claim 1, wherein the universal interface that provides the at least one electrical connection between the electronic device and the modem provides power to the electronic device.

8. The system of claim 1, wherein the universal interface that provides the at least one electrical connection between the electronic device and the modem provides a data communication port for the electronic device.

9. The system of claim 1, wherein at least part of the base component is configured to deter unauthorized access to the modem.

10. A system, comprising:
an interchangeable lid component to which an electronic device is externally mounted; and
a base component that couples to the interchangeable lid component to form a housing within which a modem is located and outside which the electronic device is located, the base component containing the modem and supporting the interchangeable lid component and electronic device, the housing configured with a universal interface that provides at least one electrical connection between the electronic device and the modem;
wherein the universal interface is accessible through the base component; and
wherein the electronic device serves as the interchangeable lid component.

11. The system of claim 10, wherein the housing is sealed to protect the modem against external environmental effects.

12. The system of claim 10, wherein the base component comprises a Faraday cage that surrounds the modem.

13. The system of claim 10, wherein the universal interface that provides the at least one electrical connection between the electronic device and the modem provides power to the electronic device and provides a data communication port for the electronic device.

14. The system of claim 10, wherein the base component comprises an access deterrent component that deters unauthorized access to the modem.

15. The system of claim 10, wherein the base component is configured to be strand mounted.

16. A system comprising an interchangeable lid component to which an electronic device is externally mounted, the interchangeable lid component configured to couple to a base component that contains a modem, to form a housing that supports the interchangeable lid component and electronic device and within which the modem is located and outside which the electronic device is located, the housing configured with a universal interface that provides at least one electrical connection between the electronic device and the modem, wherein the universal interface is accessible through the interchangeable lid component, and wherein the electronic device serves as the interchangeable lid component.

17. The system of claim 16, wherein the electronic device comprises at least one of: a camera, microphone, an external drive, a speaker, a calibration device, a diagnostic device, a cellular communications device, or a wireless access point device.

18. The system of claim 16, further comprising a first access deterrent component that deters access to the housing, and wherein the base component comprises a second access deterrent component that deters unauthorized access to the modem.

* * * * *